United States Patent [19]

Hiliger

[11] Patent Number: 5,127,012
[45] Date of Patent: Jun. 30, 1992

[54] DIAGNOSTIC AND ADMINISTRATIVE DEVICE FOR DOCUMENT PRODUCTION APPARATUS

[75] Inventor: Michael K. Hiliger, Webster, N.Y.

[73] Assignee: Eastman Kodak Company, Rochester, N.Y.

[21] Appl. No.: 657,028

[22] Filed: Feb. 19, 1991

[51] Int. Cl.⁵ .................. G01R 31/28; G06F 11/00; G03G 21/00
[52] U.S. Cl. .................. 371/29.1; 355/205; 355/206; 371/16.4
[58] Field of Search .............. 355/206, 207, 209, 205, 355/204; 371/29.1, 16.4; 340/525, 286 M; 364/267.7, 237.3, 945.4, 927.4, 550

[56] References Cited

U.S. PATENT DOCUMENTS

| | | | |
|---|---|---|---|
| 3,908,117 | 9/1975 | Naruse et al. | 235/153 AK |
| 4,095,094 | 6/1978 | Struger et al. | 235/304.1 |
| 4,408,869 | 10/1983 | Tomosada et al. | |
| 4,424,576 | 1/1984 | Lange et al. | 364/900 |
| 4,477,901 | 10/1984 | Braband et al. | 371/29.1 |
| 4,496,237 | 1/1985 | Schron | |
| 4,521,847 | 6/1985 | Ziehm et al. | 364/184 |
| 4,553,830 | 11/1985 | Nguyen | |
| 4,561,093 | 12/1985 | Doane et al. | 371/20 |
| 4,586,147 | 4/1986 | Tadokoro | 364/550 |
| 4,694,408 | 9/1987 | Zaleski | 364/551 |
| 4,709,366 | 11/1987 | Scott et al. | 371/20 |
| 4,727,545 | 2/1988 | Glackemeyer et al. | 371/29.1 X |
| 4,739,366 | 4/1988 | Braswell et al. | |
| 4,740,895 | 4/1988 | Sargent et al. | 364/200 |
| 4,757,463 | 7/1988 | Ballou et al. | 364/551 |
| 4,843,557 | 6/1989 | Ina et al. | 364/431.77 |
| 4,851,875 | 7/1989 | Tanimoto | 355/245 |
| 4,855,754 | 8/1989 | Tanaka et al. | 346/17 |
| 4,870,459 | 9/1989 | Ito et al. | 355/209 |
| 4,922,491 | 5/1990 | Coale | 371/29.1 X |
| 5,010,551 | 4/1991 | Goldsmith et al. | 355/206 X |

FOREIGN PATENT DOCUMENTS

| | | | |
|---|---|---|---|
| 0210369 | 9/1986 | Japan | 355/205 |
| 0246769 | 11/1986 | Japan | 355/206 |
| 0121865 | 5/1989 | Japan | 355/209 |

Primary Examiner—A. T. Grimley
Assistant Examiner—Thu Anh Dang
Attorney, Agent, or Firm—Milton S. Sales

[57] ABSTRACT

A document production apparatus has a plurality of replaceable units and a diagnostic system for determining the condition of the replaceable units. A computer control system monitors and controls document production functions, and includes a display for providing instructions for error diagnostic sequences. A diagnostic microprocessor for processing diagnostic signals representative of document production device conditions, has data entries, outputs, and storage for diagnostic routines. Error isolation diagnostic procedures identify suspect replaceable units. The procedures include displaying (1) a list of symptoms from which a user can select the symptom which best describes a condition of the document production apparatus, (2) a stored list of suspect replaceable units which are associated with a selected symptom, and (3) the status of each suspect replaceable unit displayed. The list of suspect replaceable units are displayed in an order of the probability of defect.

17 Claims, 5 Drawing Sheets

TYPES OF ERRORS:

C   IMAGE PROCESSING
D   CHASSIS & MAIN DRIVE
E   OFFSET HOPPER
F   FINISHER
H   FILM HANDLING
I   SCANNER
J   PAPER PATH
L   LOGIC & CONTROL
Q   COPY QUALITY
R   RASTER IMAGE PROCESSOR
S   STAPLER
W   WRITER / JOB BUFFER

FIGURE 3

PAPER PATH ERRORS:

J
1   PAPER SUPPLY
2   ENTRANCE / REGISTRATION
3   TRANSFER / DETACK
4   FUSING
5   EXIT / COOLING
6   DUPLEX PATH
7   CROSSTRACK ASSEMBLY

FIGURE 4

PAPER SUPPLY ERRORS:

| J1 | DESCRIPTION | COUNT | DATE | TIME |
|---|---|---|---|---|
| X01 | PAPER FROM FEED TRAY NOT DETECTED AT UPPER PATH | 25 | 03/12/90 | 14:02 |
| X01-A | PAPER NOT FED FROM THE DRIVE COMPONENTS | 10 | 03/12/90 | 12:02 |
| X01-B | POSSIBLE PROBLEM IN AREA OF UPPER PATH | 1 | 03/12/90 | 14:01 |
| X02 | PAPER FROM UPPER CASSETTE NOT AT UPPER PATH | 1 | 03/12/90 | 18:02 |
| X02-A | PROBLEM IN AREA OF UPPER PATH ROLLERS | 1 | 03/12/90 | 2:01 |
| X02-B | PROBLEM IN MAIN DRIVE OF PAPER SUPPLY | 0 | | |
| X03 | PAPER FROM UPPER CASSETTE STOPPED AT UPPER PATH | 0 | | |
| X03-A | PROBLEM IN AREA OF UPPER PATH ROLLERS | 18 | 03/11/90 | 8:43 |
| X03-B | PROBLEM IN CROSSTRACK MODULE | 0 | | |
| X04 | PAPER FROM FEED TRAY STOPPED AT UPPER PATH SENSOR | 0 | | |
| X05 | PLATFORM DOWN WITH DECK DOOR CLOSED | 1 | 03/10/90 | 6:21 |
| X06 | PLATFORM UP WITH DECK DOOR OPENED | 8 | 03/10/90 | 7:19 |
| X07 | PAPER SUPPLY MODULE OPENED DURING COPY CYCLE | 0 | | |

FIGURE 5

POSSIBLE CAUSES OF:
J1X02-A - PROBLEM IN AREA OF UPPER PATH ROLLERS

| FRU | | DESCRIPTION | STATUS | DETERMINED BY |
|---|---|---|---|---|
| J105 | 000 | SENSOR, UPPER PATH | GOOD | FRU TEST |
| J125 | 000 | ROLLER, FEED | GOOD | SET BY USER |
| J132 | 000 | LCM, UPPER CASSETTE | ? | UNKNOWN |
| J133 | 000 | LCM, UPPER PATH | GOOD | FRU TEST |
| J119 | 000 | CLUTCH, UPPER FEED | ? | UNKNOWN |
| J116 | 000 | CLUTCH, UPPER PATH | GOOD | OTHER FRU |
| J130 | 000 | KIT, UPPER PATH ROLLER | ? | UNKNOWN |
| L001 | 000 | BD, MEC | ? | UNKNOWN |

INV. STATU

ERROR: J1X02-A

FIGURE 6

DIAGNOSTIC AND ADMINISTRATIVE DEVICE FOR DOCUMENT PRODUCTION APPARATUS

BACKGROUND OF THE INVENTION

1. Technical Field

This invention relates generally to document production apparatus such as copiers and/or printers, and more particularly to a diagnostic and administrative device to provide a user, such as an operator or repair technician, with a quick and accurate system for defining and solving equipment problems.

2. Background Art

Document production apparatus such as for example electrophotographic copiers and printers commonly include systems for monitoring various process parameters such as paper feed timing, temperatures, availability of consumables, etc. When a parameter exceeds its set point, the apparatus may be shut down for repairs If the parameter is not critical to continued operation, the apparatus may be allowed to continue operations while an operator is alerted to the need for maintenance or other action.

Document production apparatus is available wherein the apparatus itself maintains a record of the number of occurrences of serious and less serious shutdowns. The apparatus may even trigger a call for service when a predetermined number of these less serious shutdowns have been recorded However, there is no system available for document production apparatus wherein the user is provided with a quick and accurate method for defining and solving equipment problems.

Generally, a diagnosis and repair process entails defining the problem, often in the form of a symptom or symptoms being experienced in the equipment. Normally, the symptom is defined through observation, user interview, past history, and machine problem logs. The symptom is often labeled using jargon common to the type of equipment under test. For example, symptoms in electrophotographic document production apparatus may include "smears," "jams," "supplies empty," etc.

After the symptom has been classified, the repair person either through expert knowledge or through documentation, develops a series of suspected causes to the symptom. These suspected causes are then ranked in order of probability to cause the symptom.

The repair person then begins to eliminate each possible cause by performing some type of check-out procedure. If a check-out procedure shows a failure, a repair is effected. The success of the repair in eliminating the symptom is determined. If the symptom is eliminated, the process is considered to be successfully completed. If the symptom persists, the repair person must continue checking other suspected causes until the original problem is repaired.

While the procedure is generally performed to check out only a single cause to the symptom or symptoms, information derived from specific check-outs to help eliminate one suspect cause may be used to eliminate another suspect cause. For example, if a symptom might be caused by a motor failure or by the lack of electrical power to the motor, a determination that the motor runs would also rule out the possibility that there is no power to the motor. This determination by induction is invaluable in creating an efficient diagnostic process by eliminating the need to run many checks.

Automatic diagnostic procedures are known, but currently known diagnostic processes suffer from a lack of accuracy and timeliness of the information. It is also found that no matter how good a diagnostic system is, it will never be 100% correct. Conventional automated diagnostic systems which do not embrace an opportunity for manual intervention by a trained user are severely handicapped in this regard.

DISCLOSURE OF INVENTION

One major problem found in known diagnostic processes is the accuracy and timeliness of the information. It is an object of the present invention to provide a quick and accurate tool for defining and solving equipment problems.

It is another object of the present invention to provide for the integration of information from all traditional sources such as parts lists, graphics, and procedures into a successful diagnostic system.

It is yet another object of the present invention to provide for manual intervention of the diagnostic system.

Generally, the diagnostic and repair process of the present invention entails defining the problem by the symptom or symptoms being experienced in the equipment. Normally, the symptom is defined through observation, user interview, past history, and machine problem logs. The symptom is preferably labeled using Jargon common to the type of equipment under test.

After the symptom has been classified, the process develops a series of suspected causes to the symptom. These suspected causes are ranked in order of probability to cause the symptom.

The repair person then begins to eliminate each possible cause by performing some type of check-out procedure If a check-out procedure shows a failure, a repair can be effected. The success of the repair in eliminating the symptom is determined. If the symptom is eliminated, the process is considered to be successfully completed. If the symptom persists, the repair person must continue checking other suspected causes until the original problem is repaired.

While the procedure is generally performed to check out only a single cause to the symptom or symptoms, information derived from specific check-outs to help eliminate one suspect cause may be used to eliminate another suspect cause. For example, if a symptom might be caused either by a motor failure or by the lack of electrical power to the motor, a determination that the motor runs would also rule out the possibility that there is no power to the motor. This determination by induction is invaluable in creating an efficient diagnostic process by eliminating the need to run many checks.

The invention and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which:

FIGS. 3-6 are user interface screens of the diagnostics application according to the logic flow chart of FIG. 2.

BEST MODE FOR CARRYING OUT THE INVENTION

Figure 1:
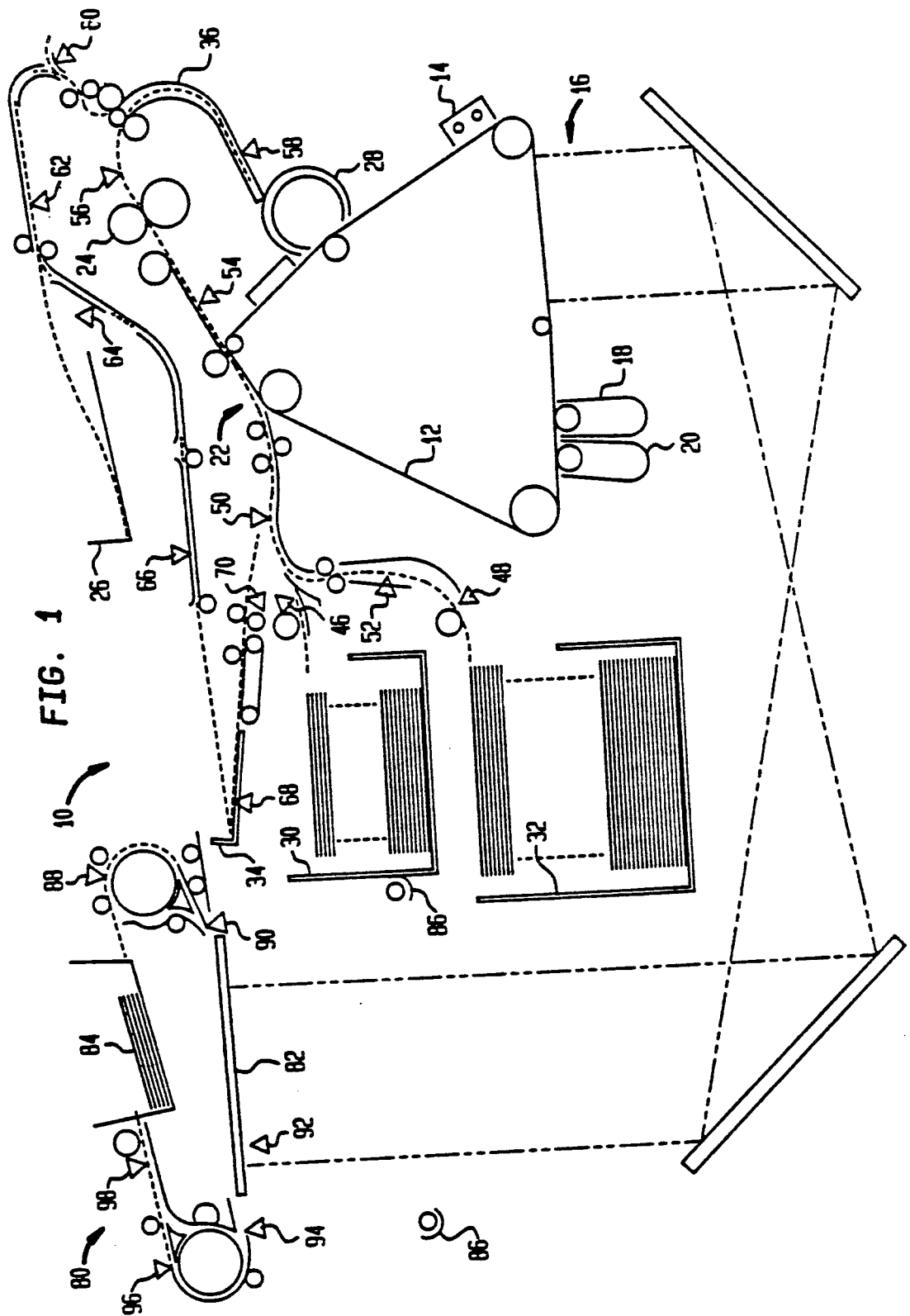
FIG. 1 is a schematic showing a side elevational view of an electrophotographic copier usable with the diagnostic and administrative device in accordance with a preferred embodiment of the invention.

The present invention relates to an apparatus and process for the diagnosis and repair of document production apparatus. The first step in any repair process is to define the problem According to the present invention, a repair person is presented with a list of observable symptoms for each of which there is a known cause or causes. Symptoms are preferably labeled using jargon common to the type of equipment under test. In electrophotographic document production apparatus, symptoms may be referred to as "smears," "jams," etc., may be referred to by machine code error number, or may be identified by the physical location in the machine where a problem is being experienced. On the basis of personal observations, user interviews, review of the history of the apparatus and machine problem logs, etc. the repair person selects the symptom from the list which best describes the situation.

Upon classification of the symptom, the repair person is presented with a list of replaceable suspect units (parts) which, if bad, could cause the apparatus to exhibit the symptom The suspect replaceable units are ranked in order of probability to cause the symptom, The ranking may be preprogrammed, or may be set on the basis of historical data such as frequency of repair, date of last repair, weighting factor entered by service representative, etc. The list of suspect replaceable units preferably includes a "status" entry., showing that the units are "good," "bad," or "unknown."

Using the list of suspect replaceable units for the symptom identified, the repair person then begins to eliminate each possible cause of the problem by performing an appropriate check-out procedure for one suspect unit at a time. Each replaceable unit has a data file with a description of the unit, its location in the apparatus, possibly a "check-out" routine, and the probability that it has failed. The probability of failure file is used to rank order the suspect list.

The repair person accesses the data file for a selected unit and performs the check-out routine identified. At that point, the "status" entry will be updated "good" or "bad." If a check-out routine shows a failure, a repair is effected. The success of the repair in eliminating the symptom is determined. If the symptom is eliminated, the process is considered to be successfully completed. If the symptom persists, the repair person must continue checking other suspect replaceable units until the original problem is repaired.

While the procedure is generally performed to check out only a single replaceable unit to the symptom or symptoms, information derived from specific check-outs to help eliminate one suspect unit may be used to eliminate another suspect unit. For example, if a symptom might be caused by a motor failure or by the lack of electrical power to the motor, a determination that the motor in fact runs would also rule out the possibility that there is no power to the motor. This determination by induction is invaluable in creating an efficient diagnostic process by eliminating the need to run many checks. As such, the status entry of any replaceable unit that can be inferred as being "good" from a check-out routing of another replaceable unit will be updated as "good" on the suspect list.

The following is a specific example of how the diagnostic and administrative device according to the present invention may be used to provide an user with a quick and accurate system for defining and solving equipment problems relating to paper Jams in an electrophotographic copier (which is one example of document production apparatus).

Referring to FIG. 1, copier 10 includes an image member 12, for example an electrophotographic web, which moves through a series of electrophotographic stations which are well known in the art. Image member 12 is first charged by a charging station 14, exposed at an exposure station 16 to an optical image to create an electrostatic image. The electrostatic image is toned at one of toner stations 18 or 20 to create a toner image defined by the electrostatic image. At a transfer station 22, the toner image is transferred to a receiving sheet, which is fed to a fuser 24 where it is fixed. The receiving sheet may be then moved to a top output tray 26 or a side output tray (not shown). Image member 12 is cleaned at a cleaning station 28 and reused.

Fresh receiving sheets are stored in first supply 30 or second supply 32. An appropriate size receiving sheet can be fed from either supply to transfer station 22 If duplex copies are to be made, the receiving sheet is fed from fuser 24 through an inverting path to an intermediate tray 34. This deposits the receiving sheets in tray 34 with the image side up. If a number of copies are to be made of the same two images (or of different images in an automatic precollation mode) a substantial stack can be accumulated in intermediate tray 34. When the second side is to be imaged, the receiving sheets are fed from intermediate tray 34 from the bottom of the stack for presentation of the bottom side of the sheet to imaging member 12 at transfer station 22 to pick up the image for the opposite side. The sheet is then fed to an output tray with images on both sides.

If images of two different colors are to be placed on the same side of a receiving sheet, the receiving sheet receives the first image at transfer station 22, and is fused at fusing station 24 as described before. However, this receiving sheet is fed first through a "J" turnaround device 36 before following the path back to intermediate tray 34. Turnaround device 36 assures that the path from transfer station 24 back to intermediate tray 34 is a noninverting path and therefore the image is on the bottom of the sheets in intermediate tray 34.

When all of the first-color images have been transferred to the receiving sheets that are stacked in intermediate tray 34, the sheets are then fed from the bottom as before to transfer station 22 to receive the images of the different color to be added to the first images to the bottom side of the sheets. The sheets may then be fed to the output tray with two-color images on one side. With proper control of the apparatus, two-color images can be formed on both sides of the sheet without use of turnaround device 36 by doing one color on each side and then the other color on each side.

As set forth above, the present invention is concerned with the diagnostic process when a failure occurs so as to maximize apparatus up-time In order to fully explain the present invention, and as an example only, this specification will describe a system for collecting data about the receiving sheet feeding system.

The paper handling example makes use of various sensors in the paper path of the copier. A plurality of sensors are positioned around the path of the receiving sheets for detecting the presence of a sheet. A pair of wait sensors 46 and 48 detect paper from the upper and lower paper supplies 30 and 32, respectively. A paper fed sensor 50 detects registration feed, and a sensor 52 monitors vertical transport. A vacuum transport sensor 54 detects pre-fuser transport, and a post-transport sensor 56 checks paper in the cooler section Sensor 58 is in "J" turnaround device 36. A sensor 60 monitors the side exit, and a sensor 62 monitors the top exit. A pair or duplex path sensors 64 and 66 check the path to intermediate tray 34, and a duplex tray sensor 68 detects paper presence in the intermediate tray. Finally, a sensor 70 is the wait sensor for paper fed from the intermediate tray.

A recirculating document feeder 80 is positioned on top of an exposure platen 82. Original documents are fed from a stack 84 to the platen for exposure by lamps 86. Turnaround paths are provided to copy the backs of the documents, and a by-pass path permits feeding singly sheet originals to the platen.

Recirculating feeder 80 is also provided with a plurality of paper sensors. Among those sensors is a paper-fed sensor 88, a platen-entrance sensor 90, a registration gate sensor 92, a platen-exit sensor 94, a postflip sensor 96, and an exit sensor 98.

The disclosed embodiment includes a control logic package which consists of control software, interface software, and logic hardware. The control logic package has a digital computer, preferably a microprocessor. The microprocessor has a stored program responsive to the input signals for sequentially actuating, then de-actuating the work stations as well as for controlling the operation and timing of many other machine functions.

Programming of a number of commercially available microprocessors is a conventional skill well understood in the art. This disclosure is written to enable a programmer having ordinary skill in the art to produce an appropriate control program for the microprocessor. The particular details of any such program would, of course, depend on the architecture of the designated microprocessor.

Figure 2:
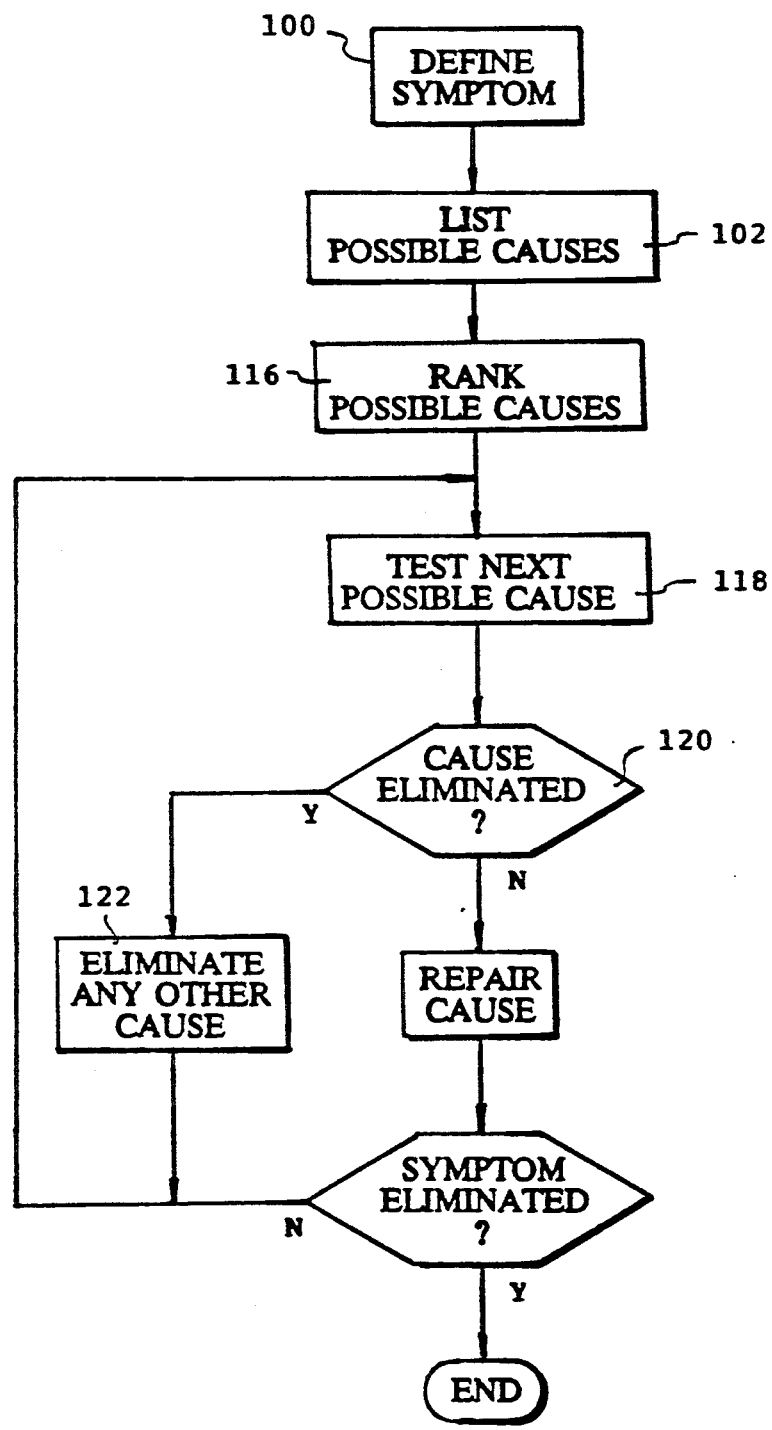
FIG. 2 is a logic flow chart according to the operation of the diagnostic and administrative device of the present invention.

Referring to FIG. 2, a logic flow chart is represented of the diagnostics application according to the illustrative embodiment of the present invention. The chart will be explained in conjunction with representative user interface screens depicted in FIGS. 3-6. The first step 100 in the diagnostic procedure is to define the observed symptom. As shown in FIG. 3, the user or service representative is presented with a screen with a list of types of errors. This list may be fairly broad, such as are the representative errors which could occur in the copier of FIG. 1. Since the illustrative example is that of a paper jam, FIG. 3 shows error "J"; a paper path malfunction, as being highlighted for selection by the service representative.

It is to be understood that user interface with the screens of the software application is conventional. Keyboard arrow keys may be used to move a selection, page up and down keys are used to display the previous or next screens, respectively, the enter key selects the highlighted selection, etc.

The purpose of the screen of FIG. 3 is to allow the user to select the "type" of error which is being experienced on the apparatus from a list of all available error types Selection may be made either by typing the character which precedes the error or by using the arrow keys to move the highlight to the desired type of error, and then pressing the "enter" key.

FIG. 4 represents a display screen which is intended to permit the user to continue the definition of the symptom, Each type of error of the screen of FIG. 3 may be associated with a "sub-type" screen such as the one shown in FIG. 4 for paper path errors. Displayed on the screen is a list of all available error sub-types for the type which was previously selected. Note that the type error previously selected is displayed in the title at the top of the sub-type screen for user convenience. Once again, selection may be made either by typing the character which precedes the error or by using the arrow keys to move the highlight to the desired sub-type error, and then by pressing the "enter" key. In the illustrated example, the selected sub-type relates to a problem in the paper (receiver sheet) supply.

FIG. 5 shows the next screen in the symptom definition process., listing all known problems in the selected "type" and "sub-type" error category (step 102 of FIG. 2). In the illustrated embodiment, the error defined as "Paper from UPPER CASSETTE not detected at UPPER PATH SENSOR" has been selected by the user. This is the final screen in the example of the symptom definition step 100 of FIG. 2. It is possible, however, to provide additional screens if needed to narrow the definition.

The screen of FIG. 5 also displays a count of the times that the item malfunctioned, as well as the last time and date of a malfunction.

Once the symptom has been defined, the user will be shown a screen (FIG. 6) listing the suspect field-replaceable units (FRU) which are known to cause the problem. This is in essence a list of suspected causes to the defined error code. The field 104 on the left of the screen contains the field-replaceable unit code of the suspected causes.

The second field 106 contains the suspect function of the field-replaceable unit. This is important because some field-replaceable units can perform more than one function, and any one function can be the cause of an error condition. In the diagnostic system, each field-replaceable unit which provides multiple functions to the system is assigned a unique number for each function. If the function number is "000", then the entire field-replaceable unit is suspect.

Field 108 of FIG. 6 is a description of the field-replaceable unit, while field 110 shows whether or not the field-replaceable unit has been determined to be operating properly. Typically, the status is updated from a check-out procedure which has been developed to determine the operation of the suspected field-replaceable unit. The status can be "GOOD" or it can be "?", which means that it is unknown if the field-replaceable unit is good.

Field 112 indicates how the status of field 110 was determined. A value "FIUJ TEST" implies that the status was set by the check-out procedure for this field-replaceable unit. A value "OTHER TEST" indicates that the status was determined by another check-out procedure and that the status was inferred from that field-replaceable unit's check-out procedure. A value "SET BY USER" shows that the user set the status using an "invert-status" function key 114 A value "UNKNOWN" indicates that the current reason the status was set is unknown.

The list is sorted with the most likely suspect cause on the top of the list according to step 116 of FIG. 4. The highlight bar will default to the first item on the list which has a status of "?" and the user can run the check-out procedure for the highlighted suspected cause by pressing the "ENTER" key; step 118 of FIG. 4. If the user wishes to run the check-out procedure for a suspect other than the default then it must be highlighted by using the menu movement keys before pressing the "ENTER" key.

After completion of a check-out procedure, the system returns to the suspect list screen of FIG. 4. If, as a result of the check-out procedure, the status of the tested unit (step 120) or any other unit (step 122) can be changed to "GOOD", the status field 110 and 112 will be updated.

If the check-out procedure detects a malfunction, the user will be instructed to replace the bad unit (step 124). Generally, this will eliminate the symptom. If not, the next most likely suspect cause will be highlighted for check-out.

The invention has been described in detail with particular reference to preferred embodiments thereof, but it will be understood that variations and modifications can be effected within the spirit and scope of the invention.

I claim:

1. A device for identifying a bad replaceable unit of "bad" status which causes an error situation in a document reproduction apparatus having a plurality of replaceable units; said device comprising:
   means for presenting a list of user-observable symptoms for each of which there is at least one known cause associated with a replaceable unit of "bad" status;
   selection means by which a user can identify from a presented list a symptom which best describes the error situation;
   means for listing replaceable units which, if bad, could cause the selected symptom; and
   means for determining an order of probability that each listed replaceable unit is bad.

2. A device as set forth in claim 1 wherein:
   said device includes means for effecting check-out routines of replaceable units; and
   said listing means includes (1) means for identifying whether the listed replaceable units are of good or bad status, and (2) means for updating the status identifying means as check-out routines are run on the listed replaceable units.

3. A device as set forth in claim 1 wherein:
   said device includes means for effecting check-out routines of replaceable units; and
   said listing means includes (1) means for identifying whether the listed replaceable units are of good or bad status, and (2) means for updating the status of one replaceable unit as check-out routines are run on other listed replaceable units.

4. A device as set forth in claim 1 wherein said replaceable unit listing means presents a list of replaceable units ranked in the order of probability that each listed replaceable unit is bad.

5. A device as set forth in claim 1 wherein said means for determining the order of probability that each listed replaceable unit is bad is adapted to determine the order on a basis of frequency of repair.

6. A device as set forth in claim 1 wherein said means for determining the order of probability that each listed replaceable unit is bad is adapted to determine a order on a basis of the date of last repair of the listed replaceable units.

7. A device as set forth in claim 1 wherein said means for determining the order of probability that each listed replaceable unit is bad is adapted to determine the order on a basis of a variable weighting factor.

8. A device as set forth in claim 1 wherein said replaceable unit listing means presents a status entry pertaining to a condition of each listed replaceable unit.

9. A device as set forth in claim 8 wherein said replaceable unit listing means presents an indication of how each status entry was determined.

10. A device as set forth in claim 9 wherein said indication of how each status entry was determined includes means for determining status (1) from a check-out procedure for the replaceable unit to which the entry applies and (2) from a check-out procedure for a replaceable unit other than the replaceable unit to which the entry applies.

11. Document production apparatus having a plurality of replaceable units and diagnostic means for determining a condition of the replaceable units; said apparatus having:
   a computer control system for monitoring and controlling document production functions;
   a display means for providing instructions for error diagnostic sequences;
   a diagnostic microprocessor for processing diagnostic signals representative of document production device conditions, said microprocessor having data entry means, data output means, and storage means for storing diagnostic routines; and
   means for utilizing error isolation diagnostic procedures to identify suspect replaceable units, said procedures including displaying (1) a list of symptoms from which a user can select a symptom which best describes a condition of the document production apparatus, (2) a list, stored in said storage means, of suspect replaceable units which are being associated with a selected symptom, and (3) whether each suspect replaceable unit displayed is of good or bad status, wherein said error isolation diagnostic procedures include displaying the list of supect replaceable units in an order of the probability of defect.

12. Document production apparatus as set forth in claim 1 wherein said error isolation diagnostic procedures includes displaying how the status of each suspect replaceable unit was determined, whether by a check-out procedure for that unit or by a check-out procedure for another unit from which the condition of that unit can be inferred.

13. For use with a document production apparatus having a plurality of replaceable units and a computer control system for monitoring and controlling document production functions, diagnostic means for determining a condition of the replaceable units; said diagnostic means comprising:
   a display means for providing instructions for error diagnostic sequences;
   a diagnostic microprocessor for processing diagnostic signals representative of document production device conditions, said microprocessor having data entry means, data output means, and storage means for storing diagnostic routines; and
   means for utilizing error isolation diagnostic procedures to identify suspect replaceable units, said procedures including displaying (1) a list of symptoms from which a user can select a symptom which best describes a condition of the document production apparatus, (2) a list, stored in said storage means, of suspect replaceable units which are being associated with a selected symptom, and (3) the status of each suspect replaceable unit displayed, wherein said error isolation diagnostic procedures include displaying the list of suspect replaceable units in an order of a probability of defect.

14. Diagnostic means as set forth in claim 13 wherein said error isolation diagnostic procedures includes displaying how the status of each suspect replaceable unit was determined, whether by a check-out procedure for that unit or by check-out procedure for another unit from which the condition of that unit can be inferred.

15. A method for identifying a bad replaceable unit which causes an error situation in a document reproduction apparatus having a plurality of replaceable units; said method comprising:

presenting a list of user-observable symptoms for each of which there is at least one known cause associated with a replaceable unit;

identifying from a presented list a symptom which best describes the error situation;

listing replaceable units which, if bad, could cause the identifed symptom, together with the status of the listed replaceable units; and determining an order of probability that each listed replaceable unit is bad.

16. The method set forth in claim 15 further comprising listing the replaceable units ranked in the order of probability that each listed replaceable unit is bad.

17. The method as set forth in claim 15 further comprising presenting a status entry pertaining to a condition of each listed replaceable unit.

* * * * *

UNITED STATES PATENT AND TRADEMARK OFFICE
CERTIFICATE OF CORRECTION

PATENT NO. : 5,127,012
DATED : June 30, 1992
INVENTOR(S) : Michael K. Hiliger

It is certified that error appears in the above-indentified patent and that said Letters Patent is hereby corrected as shown below:

Col. 7, Claim 6, line 66, after "determined" change "a" to --the--.

Col. 7, Claim 6, line 67, after "a basis of" change "the" to --a--.

Col. 8, Claim 12, line 46, after "claim" change "1" to --11--.

Signed and Sealed this

Fifth Day of October, 1993

Attest:

BRUCE LEHMAN

Attesting Officer

Commissioner of Patents and Trademarks